United States Patent
Ono et al.

(10) Patent No.: US 9,960,772 B2
(45) Date of Patent: May 1, 2018

(54) SEMICONDUCTOR DEVICE INCLUDING LOGICAL BLOCKS, WIRING GROUPS, AND SWITCH CIRCUITS

(71) Applicant: KABUSHIKI KAISHA TOSHIBA, Minato-ku (JP)

(72) Inventors: Mizuki Ono, Yokohama (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days. days.

(21) Appl. No.: 15/444,963

(22) Filed: Feb. 28, 2017

(65) Prior Publication Data
US 2018/0076813 A1 Mar. 15, 2018

(30) Foreign Application Priority Data
Sep. 9, 2016 (JP) .................................. 2016-176720

(51) Int. Cl.
*H03K 19/177* (2006.01)
(52) U.S. Cl.
CPC .............................. *H03K 19/17728* (2013.01)
(58) Field of Classification Search
CPC .................................................. H03K 19/17728
See application file for complete search history.

(56) References Cited

U.S. PATENT DOCUMENTS

| 5,883,526 A | 3/1999 | Reddy et al. |
| 6,181,159 B1 * | 1/2001 | Rangasayee ..... H03K 19/17728 326/39 |
| 6,759,869 B1 | 7/2004 | Young et al. |

(Continued)

FOREIGN PATENT DOCUMENTS

| JP | 10-233676 | 9/1998 |
| JP | 2005-101535 | 4/2005 |

(Continued)

OTHER PUBLICATIONS

Jason Cong, et al., "FlowMap: An Optimal Technology Mapping Algorithm for Delay Optimization in Lookup-Table Based FPGA Designs", IEEE Transactions on Computer-Aided Design of Integrated Circuits and Systems, vol. 13, (1), 1994, 12 pgs.

(Continued)

*Primary Examiner* — Dylan White
(74) *Attorney, Agent, or Firm* — Oblon, McClelland, Maier & Neustadt, L.L.P.

(57) ABSTRACT

A semiconductor device of an embodiment includes: a logical block including at least one first input terminal; at least two first output terminal; a first wiring line group; a second and third wiring line groups including a plurality of shorter wiring lines than wiring lines of the first wiring line group; a fourth and fifth wiring line groups; a first to fourth switch circuits; a first logical element including second and third input terminals connected to at least one of wiring lines of the fourth wiring line group, and a second output terminal connected to one of the at least two first output terminals; and a second logical element including fourth and fifth input terminals connected to at least one of the wiring lines of the fifth wiring line group, and a third output terminal connected to another of the at least two first output terminals.

8 Claims, 8 Drawing Sheets

(56) References Cited

U.S. PATENT DOCUMENTS

| | | | |
|---|---|---|---|
| 7,425,720 B2 | 9/2008 | Kaeriyama et al. | |
| 7,705,629 B1 * | 4/2010 | Pani | H03K 19/17736 |
| | | | 326/41 |
| 8,878,566 B2 | 11/2014 | Nakaya | |
| 9,264,044 B2 | 2/2016 | Yasuda et al. | |
| 9,431,104 B2 * | 8/2016 | Zaitsu | H03K 19/1776 |
| 2002/0113619 A1 * | 8/2002 | Wong | H03K 19/17736 |
| | | | 326/41 |
| 2016/0276018 A1 * | 9/2016 | Matsumoto | G11C 17/16 |
| 2017/0272078 A1 * | 9/2017 | Oda | H03K 19/17728 |

FOREIGN PATENT DOCUMENTS

| | | |
|---|---|---|
| JP | 2008-103581 | 5/2008 |
| JP | 4914423 | 4/2012 |
| JP | 2015-18590 | 1/2015 |
| JP | 2015-142175 | 8/2015 |
| JP | 2016-178183 | 10/2016 |

OTHER PUBLICATIONS

Stephen Jang, et al., "WireMap: FPGA Technology Mapping for Improved Routability and Enhanced LUT Merging," ACM Transactions of Reconfigurable Technology and Systems, vol. 2, (2), 2009, 24 pgs.

Alexander R. Marquardt, "Cluster-Based Architecture, Timing-Driven Packing and Timing-Driven Placement for FPGAs," A Thesis submitted to University of Toronto in order to require a degree of Master of Applied Science, 1999, 160 pgs.

* cited by examiner

SEMICONDUCTOR DEVICE INCLUDING LOGICAL BLOCKS, WIRING GROUPS, AND SWITCH CIRCUITS

CROSS REFERENCE TO RELATED APPLICATIONS

This application is based upon and claims the benefit of priority from prior Japanese Patent Application No. 2016-176720 filed on Sep. 9, 2016 in Japan, the entire contents of which are incorporated herein by reference.

FIELD

An embodiment of the present invention relates to a semiconductor device.

BACKGROUND

Reconfigurable semiconductor devices, such as field programmable gate arrays (FPGAs), are drawing attention these days. A rewritable logical operation circuit included in such a semiconductor device is formed with a circuit that forms a truth table having a certain number (typically, three to six) of inputs, or a network of look-up table circuits.

As will be described later, in a conventional semiconductor device, the outputs of the respective basic logic elements and the flip-flops in each logical block are connected to specific wiring lines, and therefore, the same number of wiring lines as the total number of the outputs of the basic logic elements and the flip-flops disposed in each logical block are prepared in parallel. Because of this, a large circuit area is required, which results in increases in the production costs.

DETAILED DESCRIPTION

A semiconductor device according to an embodiment includes: a logical block configured to perform a logical operation, the logical block including at least one first input terminal and at least two first output terminals. The logical block includes: a first wiring line group including a plurality of wiring lines, at least one of the wiring lines of the first wiring line group being connected to the at least one first input terminal; a second wiring line group including a plurality of shorter wiring lines than the wiring lines of the first wiring line group; a third wiring line group including a plurality of shorter wiring lines than the wiring lines of the first wiring line group; a fourth wiring line group including a plurality of wiring lines each intersecting with the wiring lines of the first and second wiring line groups; a fifth wiring line group including a plurality of wiring lines each intersecting with the wiring lines of the first and third wiring line groups; a first switch circuit including switch elements disposed in respective cross regions between at least one of the wiring lines of the first wiring line group and at least one of the wiring lines of the fourth wiring line group, each of the switch elements of the first switch circuit including a first terminal connected to the corresponding one of the wiring lines of the first wiring line group, and a second terminal connected to the corresponding one of the wiring lines of the fourth wiring line group; a second switch circuit including switch elements disposed in respective cross regions between at least one of the wiring lines of the first wiring line group and at least one of the wiring lines of the fifth wiring line group, each of the switch elements of the second switch circuit including a third terminal connected to the corresponding one of the wiring lines of the first wiring line group, and a fourth terminal connected to the corresponding one of the wiring lines of the fifth wiring line group; a third switch circuit including switch elements disposed in respective cross regions between at least one of the wiring lines of the second wiring line group and at least one of the wiring lines of the fourth wiring line group, each of the switch elements of the third switch circuit including a fifth terminal connected to the corresponding one of the wiring lines of the second wiring line group, and a sixth terminal connected to the corresponding one of the wiring lines of the fourth wiring line group; a fourth switch circuit including switch elements disposed in respective cross regions between at least one of the wiring lines of the third wiring line group and at least one of the wiring lines of the fifth wiring line group, each of the switch elements of the fourth switch circuit including a seventh terminal connected to the corresponding one of the wiring lines of the third wiring line group, and an eighth terminal connected to the corresponding one of the wiring lines of the fifth wiring line group; a first logical element configured to perform a logical operation, the first logical element including second and third input terminals connected to at least one of the wiring lines of the fourth wiring line group, and a second output terminal connected to one of the at least two first output terminals; and a second logical element configured to perform a logical operation, the second logical element including fourth and fifth input terminals connected to at least one of the wiring lines of the fifth wiring line group, and a third output terminal connected to another of the at least two first output terminals.

The background to the development of the present invention is first explained below, before an embodiment of the present invention is described.

Figure 1:
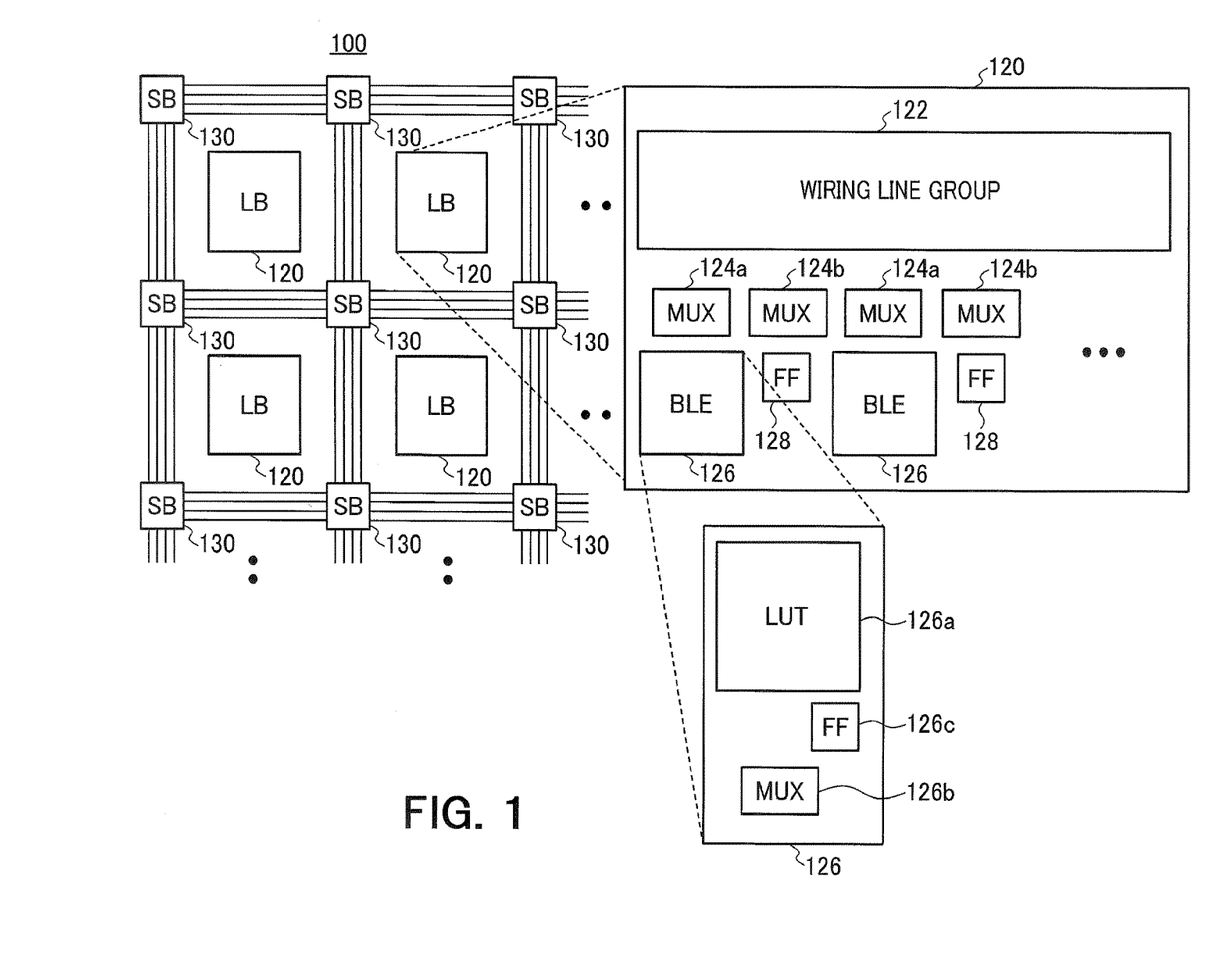
FIG. 1 is a block diagram showing an example of a semiconductor device including a rewritable logical operation circuit.

FIG. 1 shows an example of a semiconductor device including a rewritable logical operation circuit. This semiconductor device 100 includes logical blocks (hereinafter also referred to as LBs) 120 that are arranged in an array and perform logical operations, and switch blocks (hereinafter also referred to as SBs) 130 that are arranged around the respective logical blocks 120. Each switch block 130 includes a semiconductor element (not shown) that controls connection or disconnection between wiring lines arranged in horizontal and vertical directions, and enables signal transmission in a desired direction. The switch blocks 130 also connect to adjacent logical blocks 120.

Meanwhile, each logical block 120 includes a wiring line group 122, select circuits (hereinafter also referred to as MUXs) 124a and 124b, basic logic elements (hereinafter also referred to as BLEs) 126, and flip-flops (hereinafter also referred to as FFs) 128. Each basic logic element 126 performs a logical operation in accordance with a signal sent via an input terminal of the logical block 120, some of the wiring lines in the wiring line group 122, and a select circuit 124a, and outputs the operation result to one of the output terminals of the logical block 120 and the wiring line group 122.

Each basic logic element 126 includes a look-up table circuit (hereinafter also referred to as LUT) 126a, a select circuit (hereinafter also referred to as MUX) 126b, and a flip-flop 126c. The look-up table circuit 126a can obtain any desired logical function. The flip-flop 126c is used in obtaining a synchronized output or in forming a sequential logic. Therefore, there may be a basic logic element that does not include any flip-flop. The look-up table circuit 126a performs a logical operation in accordance with the value of a signal input to the basic logic element 126, and outputs the operation result to one of the output terminals of the logical block 120 and the wiring line group 122 via the select circuit 126b, and to the input terminal of the flip-flop 126c. Each flip-flop 128 has an input terminal connected to the output terminal of the corresponding select circuit 124b, has an output terminal connected to one of the output terminals of the logical block 120 and one of the wiring lines in the wiring line group 122.

In the description below, a logical block 120 will be described in detail with reference to FIG. 2, and the look-up table circuits included in this logical block 120 are look-up table circuits each having four inputs, for example.

Figure 2:
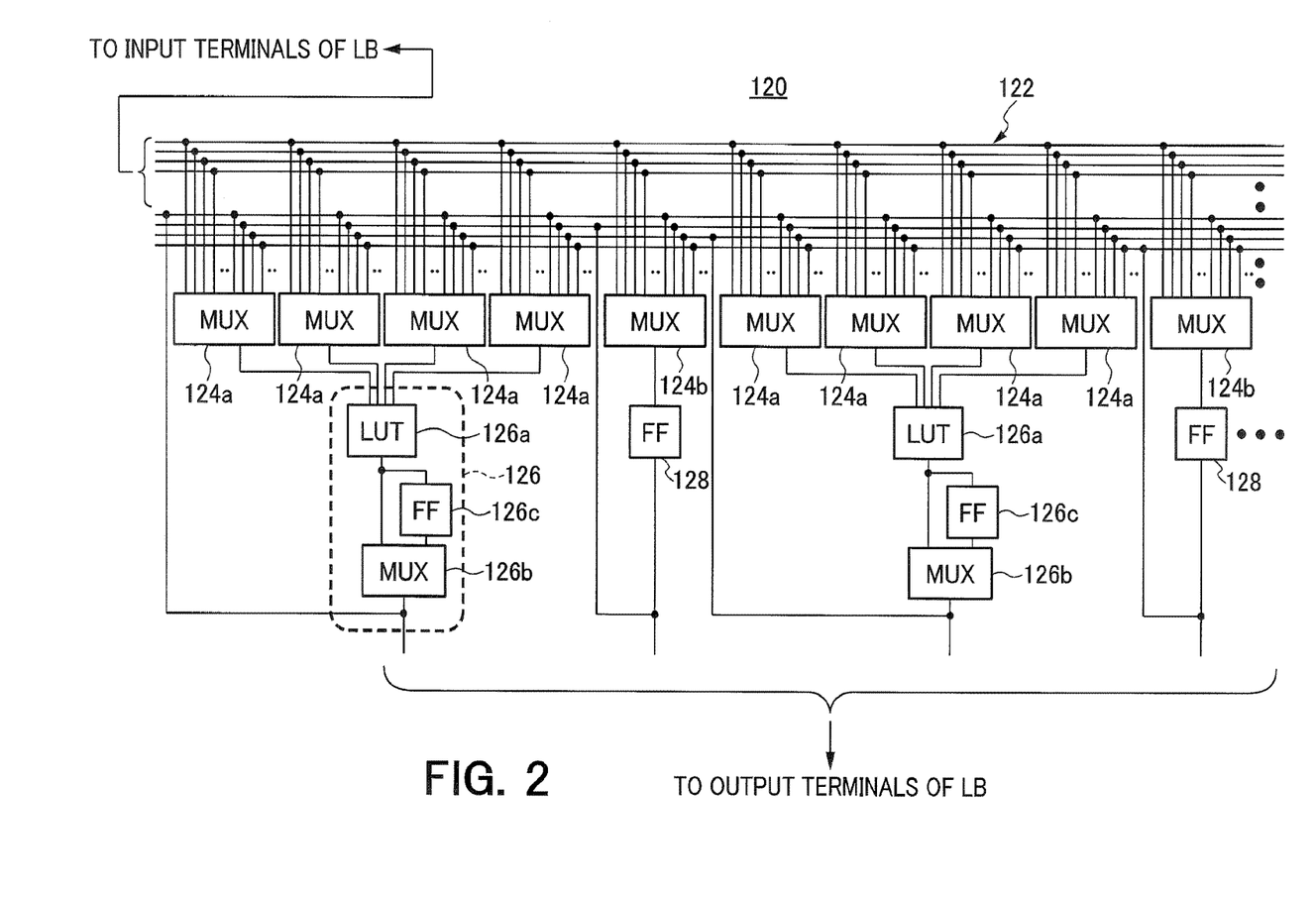
FIG. 2 is a circuit diagram showing a specific example of a logical block.

As shown in FIG. 2, this logical block 120 includes a wiring line group 122 of wiring lines, select circuits 124a and 124b, basic logic elements 126, and flip-flops 128, like the logical block 120 described above with reference to FIG. 1. Each basic logic element 126 includes a look-up table circuit 126a, a select circuit 126b, and a flip-flop 126c.

Each select circuit 124a has eight input terminals each connected to some of the wiring lines in the wiring line group 122, for example. The respective output terminals of four select circuits 124a are connected to the four input terminals of a look-up table circuit 126a. The output terminal of each look-up table circuit 126a is connected to the input terminal of the flip-flop 126c and one of the input terminals of the select circuit 126b. The output terminal of each select circuit 126b is connected to one of the output terminals of the logical block 120 and one of the wiring lines in the wiring line group 122.

It should be noted that one select circuit 124b is disposed for each flip-flop 128, and the input terminal of each flip-flop 128 is connected to the output terminal of each corresponding select circuit 124b. The output terminal of each flip-flop 128 is connected to one of the output terminals of the logical block 120 and one of the wiring lines in the wiring line group 122.

Figure 3:
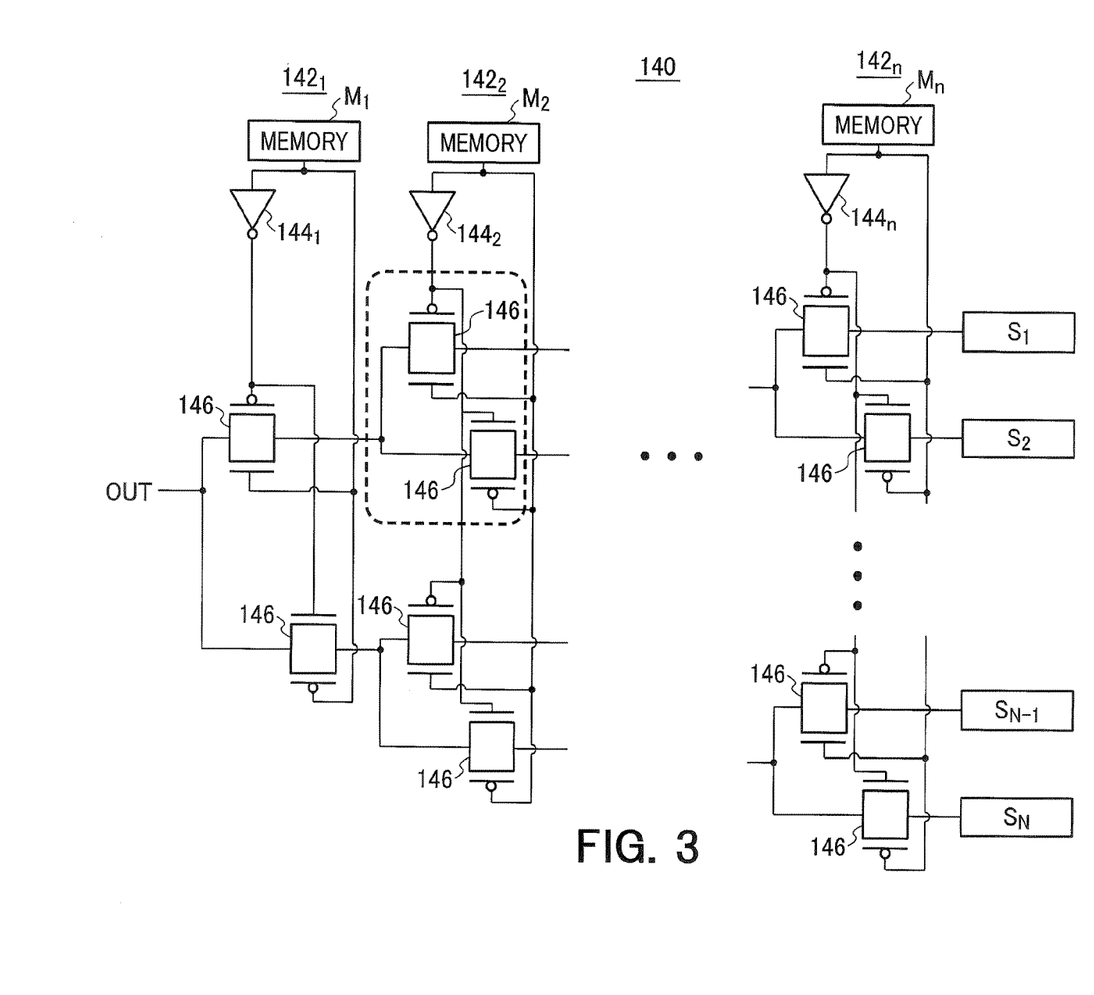
FIG. 3 is a circuit diagram showing a specific example of a select circuit in a basic logic element.

The select circuit 140 shown in FIG. 3 is used as each of the select circuits 124a and 124b or each of the select circuits 126b, for example. In this select circuit 140, the number of inputs is N (≥2).

In the select circuits 124a and 124b shown in FIG. 2, N is the sum of the total number of the outputs of the basic logic elements and the flip-flops disposed in one logical block shown in FIG. 1 and the number of the input terminals of the logical block. In the select circuits 126b, N is 2.

This select circuit 140 includes n (≥1) stages of selecting units $142_1$ through $142_n$. Each selecting unit $142_i$ (i=1, . . . , n) includes a memory $M_i$, an inverter $144_i$, and $k_i$ ($2 \le k_i \le 2^i$) transfer gates 146. Each transfer gate 146 includes a pair of a p-channel transistor and an n-channel transistor. Each memory $M_i$ (i=1, . . . , n) stores data "0" or data "1". Either of the data is stored into each memory $M_i$ (i=1, . . . , n) from outside when the semiconductor device is used. Each inverter $144_i$ (i=1, . . . , n) has an input terminal connected to the corresponding memory $M_i$.

In each selecting unit $142_i$ (i=1, . . . , n), the $k_i$ ($2 \le k_i \le 2^i$) transfer gates 146 are divided into pairs of transfer gates.

In each pair of transfer gates, the gate of the p-channel transistor as one of the transfer gates, and the gate of the n-channel transistor as the other transfer gate are connected to the output terminal of the corresponding inverter $144_i$. The gate of the n-channel transistor as the one of the transfer gates, and the gate of the p-channel transistor as the other transfer gate are connected to the corresponding memory $M_i$. In each transfer gate of each selecting unit $142_i$ (i=1, . . . , n−1), the input terminal is connected to the respective output terminals of the two transfer gates of a transfer gate pair in the selecting unit $142_{i+1}$. The selecting unit $142_n$ includes N ($\le 2^n$) transfer gates 146, and the input terminal of the jth (1≤j≤N) transfer gate from the top receives an input signal $S_j$.

In the select circuit 140 having such a configuration, one of input signals $S_1$ through $S_N$ is output from the output terminal OUT of the select circuit 140.

With the select circuits 124a and 124b each having such a configuration, the input terminal of the look-up table circuit 126a in each basic logic element 126 and the input terminal of each flip-flop 128 are connected to input terminals of the logical block 120, or to the output terminal of the look-up table circuit 126a of another basic logic element 126 or the output terminal of another flip-flop 128.

Also, with the select circuit 126b having two inputs in each basic logic element 126, a signal that is output from the output terminal of the look-up table circuit 126a or the output terminal of the flip-flop 126c is output from the output terminal of the basic logic element 126.

The values to be stored into the memories in each select circuit 140 or the memories $M_1$ through $M_n$ are set, and these values define the terminal to which the input signal of each look-up table circuit 126a and each flip-flop 128 is to be connected, and which one of the output signals of the look-up table circuit 126a and the flip-flop 126c in each basic logic element 126 is to be selected. With this, a desired logical system can be formed in the entire circuit.

Where N represents the number of the inputs to each of the look-up table circuits forming the network, all the N inputs are not necessarily used in all the look-up table circuits, and some of the look-up table circuits may use M (<N) of the N inputs.

Figure 4:
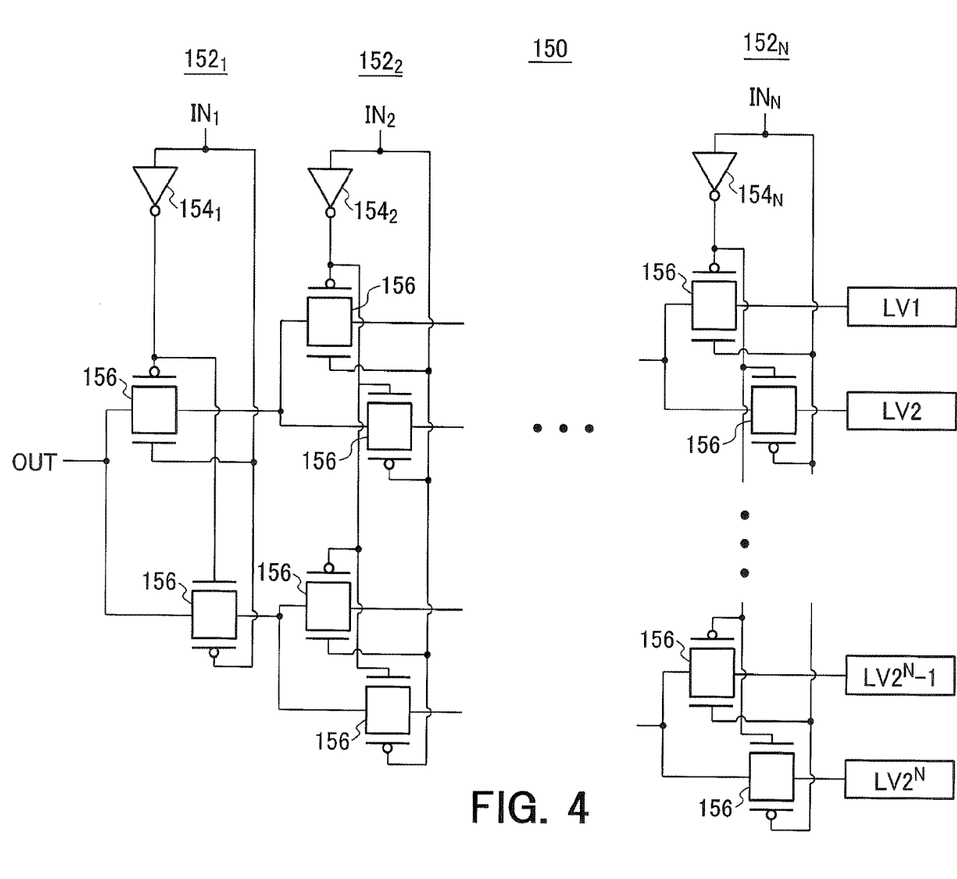
FIG. 4 is a circuit diagram showing a specific example of a look-up table circuit in the basic logic element.

FIG. 4 shows an example of a look-up table circuit having N inputs. This look-up table circuit 150 includes N selecting units $152_1$ through $152_N$. Each selecting unit $152_i$ (i=1, . . . , N) includes an inverter $154_i$ and $2^i$ transfer gates 156. Each transfer gate 156 includes a pair of a p-channel transistor and an n-channel transistor. Each inverter $154_i$ (i=1, . . . , N) has an input terminal connected to the corresponding input terminal $IN_i$ of the look-up table circuit 150.

In each selecting unit $152_i$ (i=1, . . . , N), the $2^i$ transfer gates 156 are divided into pairs of transfer gates. In each pair of transfer gates, the gate of the p-channel transistor as one of the transfer gates, and the gate of the n-channel transistor as the other transfer gate are connected to the output terminal of the corresponding inverter $154_i$. The gate of the n-channel transistor as the one of the transfer gates, and the gate of the p-channel transistor as the other transfer gate are connected to the input terminal $IN_i$ of the selecting unit $152_i$. In each transfer gate of each selecting unit $152_i$ (i=1, . . . , N−1), the input terminal is connected to the respective output terminals of the two transfer gates of a transfer gate pair in the selecting unit $152_{i+1}$. The selecting unit $152_N$ includes $2^N$ transfer gates 156, and the input terminal of the jth ($1 \leq j \leq 2^N$) transfer gate from the top receives a logical value LVj.

In the look-up table circuit 150 having such a configuration, one of the logical values LV1 through $LV2^N$ is selected, and is then output from the output terminal OUT of the look-up table circuit 150.

As the $2^N$ logical values LV1 through $LV2^N$, values determined in accordance with the logical system on which arithmetic processing is to be performed by this look-up table circuit 150 are stored into a memory (not shown). As for the number of the transistors necessary in this look-up table circuit 150 excluding the memory portion that stores logical values, each selecting unit $152_i$ (i=1, . . . , N) includes $2^i$ transfer gates 156 and an inverter $154_i$, each transfer gate 156 being formed with two transistors, the inverter $154_i$ being formed with two transistors. Therefore, $(2^{i+1}+2)$ transistors are necessary in each selecting unit $152_i$ (i=1, . . . , N). Accordingly, a total of $(2^{N+2}+2N-4)$ transistors are necessary in the entire look-up table circuit 150.

Where a static random access memory (SRAM) formed with six transistors is used to store logical values, for example, six transistors are necessary for each logical value. Therefore, a total of $(5 \times 2^{N+1}+2N-4)$ transistors are necessary. In cases where N is two, three, four, five, and six, the numbers of necessary transistors are 40, 82, 164, 326, and 648, respectively. In this manner, the number of the necessary transistors increases rapidly with an increase in the number N of inputs.

As described above, only some of the inputs are used in a look-up table circuit in some cases. Therefore, an excessively large number of transistors are disposed in a semiconductor device that uses look-up table circuits as logical gates. As a result, an excessively large chip area is required.

Also, as described above, in a conventional semiconductor device, the outputs of the respective basic logic elements and the flip-flops in each logical block are connected to specific wiring lines, and therefore, the same number of wiring lines as the total number of the outputs of the basic logic elements and the flip-flops disposed in each logical block need to be prepared in parallel. Because of this, a large circuit area is required, which results in increases in the production costs.

Since the outputs of the respective basic logic elements and the flip-flops are connected to specific wiring lines, if one of the wiring lines has a defect such as disconnection, the defective logical block cannot be used, and the yield becomes lower. As a result, the production costs become higher. To avoid such a problem, another logical block in the semiconductor device may be used. To do so, however, it is necessary to prepare an excessively large number of logical blocks. In that case, an excessively large circuit area is required. As a result, the production costs also become higher.

Also, in a conventional semiconductor device, the wiring lines in each logical block extend from one end to the other end of the logical block, and therefore, the wiring capacitance is large. This causes an increase in wiring delay, and therefore, the operation speed of the circuit becomes lower.

Each look-up table circuit in a conventional semiconductor device is formed with a large number of transistors, as described above. For this reason, a large circuit area is also required, which results in increases in the production costs.

In view of the above, the inventors made intensive studies, and found that the circuit area can be reduced by reducing the number of the wiring lines to be prepared in parallel. The inventors discovered that, to reduce the number of the wiring lines to be prepared in parallel, wiring lines that extend from one end to the other end of a logical block, and shorter wiring lines than those wiring lines should be prepared as the wiring lines in each logical block.

In the description below, an embodiment of the present invention will be described in detail, with reference to the accompanying drawings. However, the present invention is not limited to the embodiment described below, and various modifications may be made to the embodiment.

Embodiment

Figure 5:
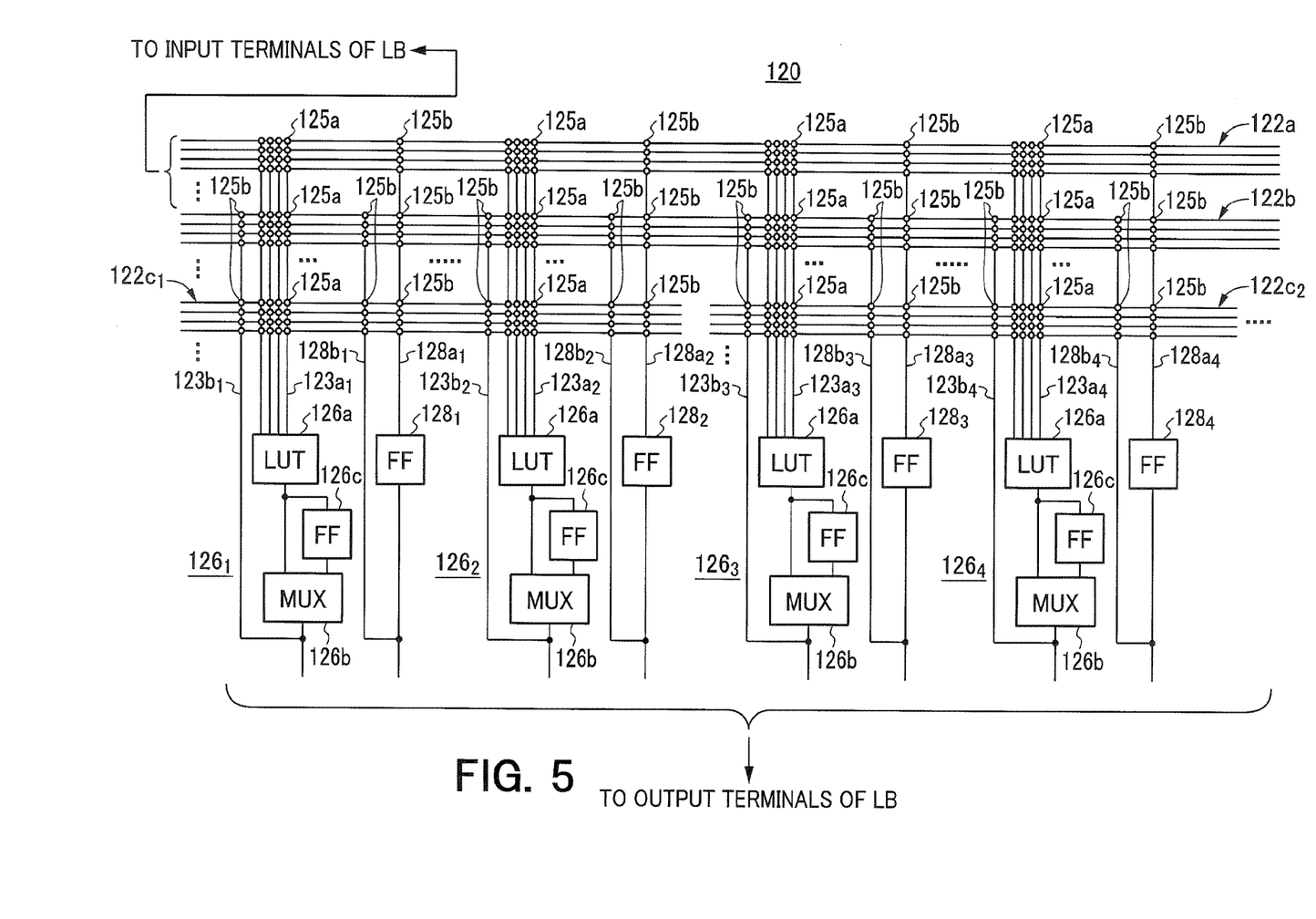
FIG. 5 is a circuit diagram showing a logical block in a semiconductor device according to an embodiment.

Referring now to FIG. 5, a semiconductor device according to an embodiment is described. The semiconductor device of this embodiment includes logical blocks that are arranged in an array and perform logical operations, and switch blocks that are arranged around the respective logical blocks, like the semiconductor device described above with reference to FIG. 1. Each switch block includes a semiconductor element (not shown) that controls connection or disconnection between wiring lines arranged in horizontal and vertical directions, and enables signal transmission in a desired direction. The switch blocks also connect to adjacent logical blocks.

FIG. 5 shows a specific example of a logical block of this embodiment. This logical block 120 includes a wiring line group 122a, a wiring line group 122b, wiring line groups $122c_1$ and $122c_2$, input wiring line groups $123a_1$ through $123a_4$, output wiring lines $123b_1$ through $123b_4$, cross-point switch circuits 125a and 125b, basic logic elements $126_1$ through $126_4$, flip-flops $128_1$ through $128_4$, input wiring lines $128a_1$ through $128a_4$, and output wiring lines $128b_1$ through $128b_4$. The input wiring line groups $123a_i$ (i=1, 2, 3, 4) each include input wiring lines (four wiring lines in FIG. 5).

Each basic logic element $126_i$ (i=1, 2, 3, 4) includes input terminals connected to the respective input wiring lines in the corresponding input wiring line group $123a_i$, and an output terminal connected to the corresponding output wiring line $123b_i$. Each basic logic element $126_i$ (i=1, 2, 3, 4) also includes a look-up table circuit 126a, a select circuit (hereinafter also referred to as MUX) 126b, and a flip-flop 126c. In each basic logic element $126_i$ (i=1, 2, 3, 4), the input terminals are the input terminals of the look-up table circuit 126a, and the output terminal is the output terminal of the select circuit 126b. It should be noted that each select circuit 126b has two input terminals.

In each basic logic element $126_i$ (i=1, 2, 3, 4), the output terminal of the look-up table circuit 126a is connected to one of the two input terminals of the select circuit 126b and the input terminal of the flip-flop 126c. Meanwhile, the output terminal of the flip-flop 126c is connected to the other input terminal of the two input terminals of the select circuit 126b. Therefore, in each basic logic element $126_i$ (i=1, 2, 3, 4), the input terminals of the look-up table circuit 126a are connected to the input wiring lines in the corresponding input wiring line group $123a_i$, and the output terminal of the select circuit $126b$ is connected to the corresponding output wiring line $123b_i$.

Each flip-flop $128_i$ (i=1, 2, 3, 4) has an input terminal connected to the corresponding input wiring line $128a_i$, and has an output terminal connected to the corresponding output wiring line $128b_i$.

Meanwhile, the cross-point switch circuits $125a$ are disposed in the cross regions between the respective input wiring line groups $123a_1$ through $123a_4$ and the wiring line group $122a$, the cross regions between the respective input wiring line groups $123a_1$ through $123a_4$ and the wiring line group $122b$, the cross regions between the respective input wiring line groups $123a_1$ and $123a_2$ and the wiring line group $122c_1$, and the cross regions between the respective input wiring line group $123a_3$ and $123a_4$ and the wiring line group $122c_2$.

The cross-point switch circuits $125b$ are disposed in the cross regions between the respective output wiring lines $123b_1$ through $123b_4$ and the wiring line group $122b$, the cross regions between the respective output wiring lines $123b_1$ and $123b_2$ and the wiring line group $122c_1$, the cross regions between the respective output wiring lines $123b_3$ and $123b_4$ and the wiring line group $122c_2$, the cross regions between the respective output wiring lines $128b_1$ through $128b_4$ and the wiring line group $122b$, the cross regions between the respective output wiring lines $128b_1$ and $128b_2$ and the wiring line group $122c_1$, the cross regions between the respective output wiring lines $128b_3$ and $128b_4$ and the wiring line group $122c_2$, the cross regions between the respective input wiring lines $128a_1$ through $128a_4$ and the wiring line group $122a$, the cross regions between the respective input wiring lines $128a_1$ through $128a_4$ and the wiring line group $122b$, the cross regions between the respective input wiring lines $128a_1$ and $128a_2$ and the wiring line group $122c_1$, and the cross regions between the respective input wiring lines $128a_3$ and $128a_4$ and the wiring line group $122c_2$.

That is, the wiring line group $122a$ can be connected to the basic logic elements $126_1$ through $126_4$ via the respective input wiring line groups $123a_1$ through $123a_4$ and the switch circuits $125a$, and can be connected to the flip-flops $128_1$ through $128_4$ via the respective input wiring lines $128a_1$ through $128a_4$ and the switch circuits $125b$.

The wiring line group $122b$ can be connected to the basic logic elements $126_1$ through $126_4$ via the respective input wiring line groups $123a_1$ through $123a_4$ and the switch circuits $125a$, and via the respective output wiring lines $123b_1$ through $123b_4$ and the switch circuits $125b$. The wiring line group $122b$ can also be connected to the flip-flops $128_1$ through $128_4$ via the respective input wiring lines $128a_1$ through $128a_4$ and the switch circuits $125b$, and via the respective output wiring lines $128b_1$ through $128b_4$ and the switch circuits $125b$.

The wiring line group $122c_1$ can be connected to the basic logic elements $126_1$ and $126_2$ via the respective input wiring line groups $123a_1$ and $123a_2$ and the corresponding switch circuits $125a$, and via the respective output wiring lines $123b_1$ and $123b_2$ and the corresponding switch circuits $125b$. The wiring line group $122c_1$ can also be connected to the flip-flops $128_1$ and $128_2$ via the respective input wiring lines $128a_1$ and $128a_2$ and the corresponding switch circuits $125b$, and via the respective output wiring lines $128b_1$ and $128b_2$ and the corresponding switch circuits $125b$.

The wiring line group $122c_2$ can be connected to the basic logic elements $126_3$ and $126_4$ via the respective input wiring line groups $123a_3$ and $123a_4$ and the corresponding switch circuits $125a$, and via the respective output wiring lines $123b_3$ and $123b_4$ and the corresponding switch circuits $125b$. The wiring line group $122c_2$ can also be connected to the flip-flops $128_3$ and $128_4$ via the respective input wiring lines $128a_3$ and $128a_4$ and the corresponding switch circuits $125b$, and via the respective output wiring lines $128b_3$ and $128b_4$ and the corresponding switch circuits $125b$.

In each basic logic element $126_i$ (i=1, 2, 3, 4), the look-up table circuit $126a$ can form a desired logical function. The flip-flop $126c$ is used in obtaining a synchronized output or in forming a sequential logic. Therefore, a logical block may include a basic logic element that does not include any flip-flop $126c$.

Each look-up table circuit $126a$ performs a logical operation in accordance with the value of a signal input to an input terminal of the basic logic element including this look-up table circuit $126a$, and outputs the operation result to an input terminal of the select circuit $126b$, and to the input terminal of the flip-flop $126c$.

The select circuit $126b$ selects one of the signals transmitted from the look-up table circuit $126a$ and the flip-flop $126c$, and outputs the selected signal to one of the output terminals of the logical block $120$, and to the wiring line group $122b$ and the wiring line group $122c_1$ or $122c_2$. For example, each select circuit $126b$ in the basic logic elements $126_1$ and $126_2$ selects one of the signals transmitted from the look-up table circuit $126a$ and the flip-flop $126c$, and outputs the selected signal to one of the output terminals of the logical block $120$, and to the wiring line group $122b$ and the wiring line group $122c_1$. Meanwhile, each select circuit $126b$ in the basic logic elements $126_3$ and $126_4$ selects one of the signals transmitted from the look-up table circuit $126a$ and the flip-flop $126c$, and outputs the selected signal to one of the output terminals of the logical block $120$, and to the wiring line group $122b$ and the wiring line group $122c_2$.

Figure 6:
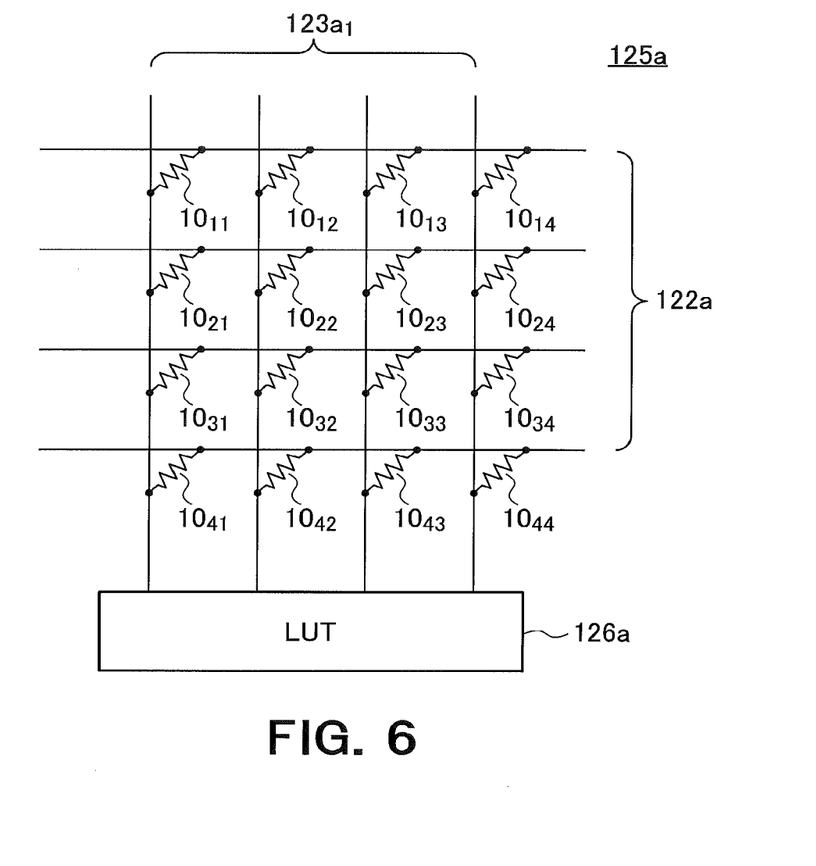
FIG. 6 is a circuit diagram showing a specific example of a switch circuit.
Figure 7A:
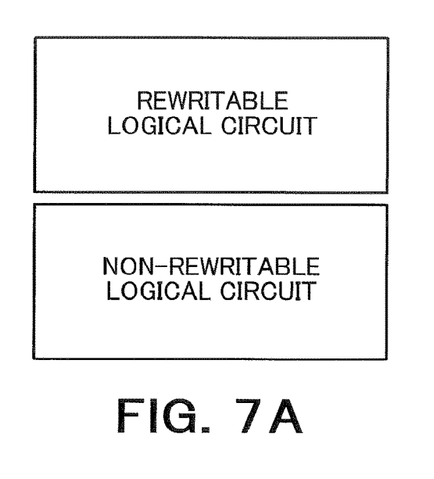
FIGS. 7A through 7D are diagrams showing examples of the numbers and arrangement of rewritable logical circuits and non-rewritable logical circuits.
Figure 7B:
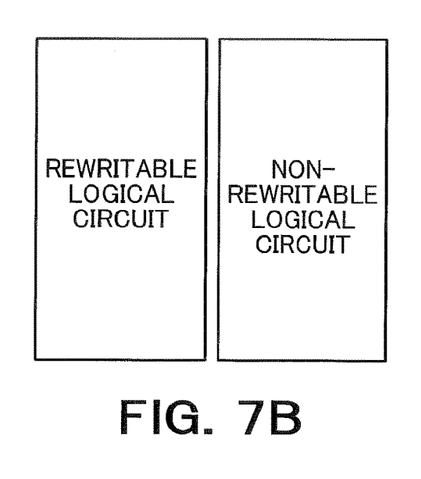
Figure 7C:
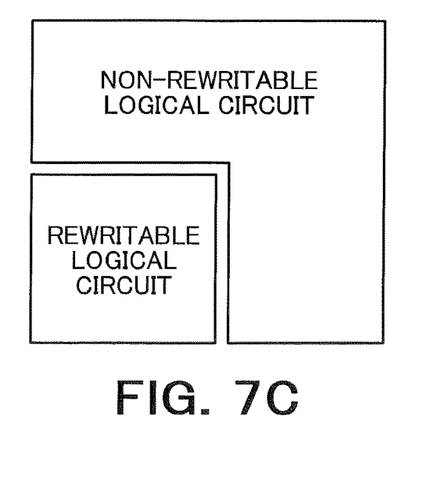
Figure 7D:
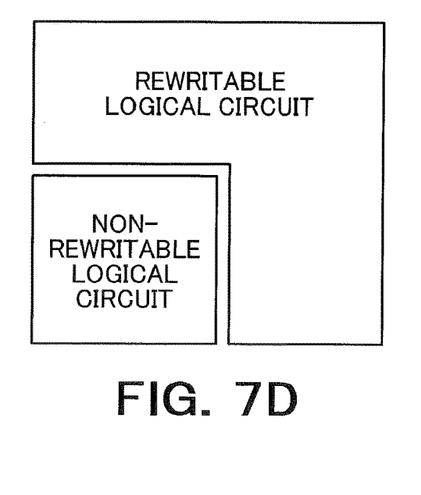
Figure 8A:
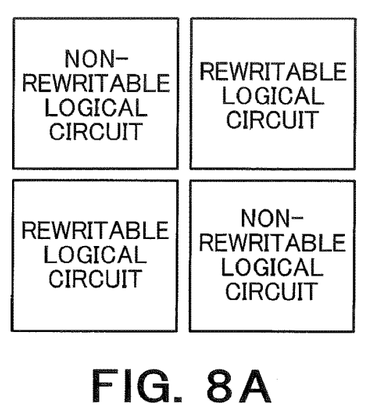
FIGS. 8A through 8D are diagrams showing examples of the numbers and arrangement of rewritable logical circuits and non-rewritable logical circuits.
Figure 8B:
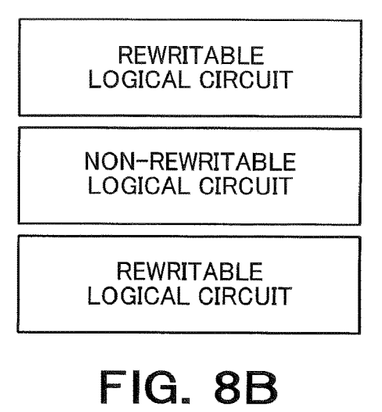
Figure 8C:
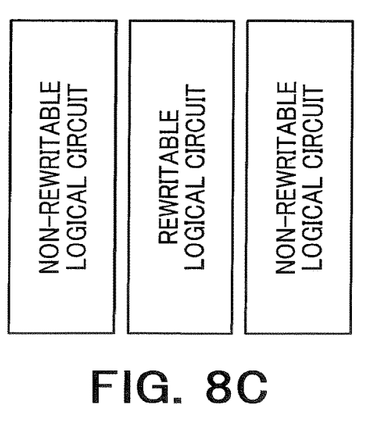
Figure 8D:
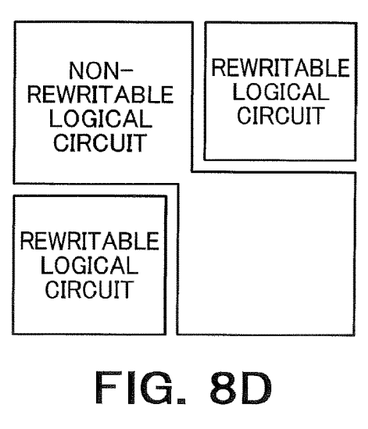

Referring now to FIG. 6, a specific example of a cross-point switch circuit $125a$ is described. FIG. 6 is a circuit diagram showing a specific example of a cross-point switch circuit $125a$ disposed in the cross region between the wiring line group $122a$ and the input wiring line group $123a_1$ of the basic logic element $126_1$. Switch elements $10_{11}$ through $10_{44}$ are disposed in the respective cross regions between the four wiring lines of the wiring line group $122a$ and the four input wiring lines of the input wiring line group $123a_1$. Each switch element $10_{ij}$ (i, j=1, 2, 3, 4) includes a first terminal and a second terminal. The first terminal is connected to the corresponding one of the four wiring lines of the wiring line group $122a$, and the second terminal is connected to the corresponding one of the four input wiring lines of the input wiring line group $123a_1$.

Each switch element $10_{ij}$ (i, j=1, 2, 3, 4) may be a resistive change element or an anti-fuse element, for example. Examples of resistive change elements include a magnetic tunnel junction (MTJ) element, an oxidation-reduction resistive change element, an ion-conducting resistive change element, and a phase-change element. Examples of anti-fuse elements include a one-time programmable (OTP) element such as a gate-oxide-film breakdown transistor.

When writing is performed on a switch element $10_{ij}$ (i, j=1, 2, 3, 4), the resistance state of the switch element $10_{ij}$ changes. Specifically, the resistance state changes from a high-resistance state to a low-resistance state, or changes from a low-resistance state to a high-resistance state. For example, when writing is performed on the switch element $10_{11}$, and the switch element $10_{11}$ is put into a high-resistance state, the portion between the first terminal and the second terminal of the switch element $10_{11}$ is in a high-resistance state. Therefore, any signal does not flow between the corresponding wiring line of the wiring line group $122a$ to which the first terminal is connected and the corresponding input wiring line of the input wiring line group $123a_1$ to which the second terminal is connected. When the switch element $10_{11}$ is in a low-resistance state, on the other hand, signals flow between the corresponding wiring line of the wiring line group $122a$ to which the first terminal is connected and the corresponding input wiring line of the input wiring line group $123a_1$ to which the second terminal is connected. It should be noted that writing on a switch element $10_{ij}$ (i, j=1, 2, 3, 4) is performed by applying a write voltage from outside the logical block $120$ to the portion between the corresponding wiring line of the wiring line group $122a$ and the corresponding input wiring line of the input wiring line group $123a_1$.

Meanwhile, in a cross-point switch circuit $125b$, switch elements are provided in the cross regions between the input wiring line $128a_1$ and the four wiring lines of the wiring line group $122a$, for example, as in a switch circuit $125a$. The input wiring line $128a_1$ is connected to the first terminals of these switch elements, and the corresponding wiring lines of the wiring line group $122a$ are connected to the second terminals of the switch elements.

The logical block $120$ including such a configuration includes the wiring line groups $122a$ and $122b$, and the wiring line groups $122c_1$ and $122c_2$. The wiring line group $122a$ extends from one end to the other end of the logical block $120$, and can be connected to the respective input terminals of all the basic logic elements $126_1$ through $126_4$ and all the flip-flops $128_1$ through $128_4$ in the logical block $120$. The wiring line group $122b$ extends from one end to the other end of the logical block $120$, and can be connected to the respective input terminals and the respective output terminals of all the basic logic elements $126_1$ through $126_4$ and all the flip-flops $128_1$ through $128_4$ in the logical block $120$. The wiring line group $122c_1$ has a shorter wiring line length than the wiring line groups $122a$ and $122b$, and can be connected to the respective input terminals and the respective output terminals of the basic logic elements $126_1$ and $126_2$ and the flip-flops $128_1$ and $128_2$ in the logical block $120$. The wiring line group $122c_2$ has a shorter wiring line length than the wiring line groups $122a$ and $122b$, and can be connected to the respective input terminals and the respective output terminals of the basic logic elements $126_3$ and $126_4$ and the flip-flops $128_3$ and $128_4$ in the logical block $120$.

In the logical block $120$, the wiring line groups $122a$, $122b$, $122c_1$, and $122c_2$ are connected to the input terminals or the output terminals of the basic logic elements $126_1$ through $126_4$ and the flip-flops $128_1$ through $128_4$ in the logical block $120$ by cross-point switch circuits that can switch the respective connection states between connection and disconnection. As described above, in the logical block $120$, the output terminals of the basic logic elements $126_1$ through $126_4$ and the flip-flops $128_1$ through $128_4$ are connected to the wiring line groups $122b$, $122c_1$, and $122c_2$ by cross-point switch circuits that can switch the respective connection states between connection and disconnection. Because of this, there is no need to prepare the same number of parallel wiring lines as the total number of the outputs of the basic logic elements $126_1$ through $126_4$ and the flip-flops $128_1$ through $128_4$ in the logical block $120$, and only a smaller number of wiring lines than that are required.

Further, the wiring line groups $122c_1$ and $122c_2$ can connect the input terminals and the output terminals of some of the basic logic elements in the logical block $120$ to the input terminals and the output terminals of some of the flip-flops in the logical block $120$. These wiring line groups $122c_1$ and $122c_2$ are arranged in parallel in the extending direction of the wiring lines. Because of this, there is no need to prepare the same number of parallel wiring lines as the total number of the output terminals of the basic logic elements $126_1$ through $126_4$ and the flip-flops $128_1$ through $128_4$ in each logical block $120$, and only a smaller number of wiring lines need to be arranged in parallel. Accordingly, the area of the logical block is reduced, and as a result, the circuit area can also be reduced. This also reduces the number of the switch elements in each switch circuit that can switch the connection state between connection and disconnection. Thus, the yield can be advantageously increased. As a result, in a case where a certain wiring line has a defect such as disconnection, another wiring line in the logical block $120$ can be used. That is, wiring line redundancy is obtained. Thus, the yield can be advantageously increased, without any excess logical blocks.

Further, as the area of the logical block $120$ is reduced, redundancy among the wiring lines can be advantageously obtained, without any increase in the circuit area like the increase in a conventional case.

Each logical block $120$ in the semiconductor device of this embodiment includes the wiring line groups $122a$ and $122b$, and the wiring line groups $122c_1$ and $122c_2$ with a shorter wiring line length than the wiring line groups $122a$ and $122b$. With this, the wiring capacitance in signal transmission among the basic logic elements and the flip-flops connected to the wiring line groups $122c_1$ and $122c_2$ is reduced.

Accordingly, the delay time is shortened, and the operation speed is advantageously increased.

Further, while multiplexers are used in a conventional semiconductor device, the semiconductor device of this embodiment includes switch circuits that can switch the connection states among the wiring lines between connection and disconnection. Because of this, multiplexers become unnecessary, and the configuration is simplified. Thus, the yield can be advantageously increased. Also, the regions used for the multiplexers in a conventional semiconductor device becomes unnecessary, and the circuit area can be reduced accordingly.

The conventional technology disclosed in JP-A H10-233676 (KOKAI) also involves a wiring line group that extends from one end to the other end of a logical block, and a wiring line group that is shorter and is connected only to a certain basic logic element in each logical block. In the conventional technology, however, the connection between such a wiring line group and a certain basic logic element is fixed. Therefore, even when a certain wiring line in the shorter wiring line group is not being used, the certain wiring line is connected to the output of the certain basic logic element, and contributes to the capacitance among the wiring lines. This hinders an increase in the operation speed.

In the semiconductor device of this embodiment, on the other hand, the wiring lines that can be connected only to the output terminals of some of the basic logic elements and some of the flip-flops are connected to the output terminals of these basic logic elements and flip-flops by switch circuits that can switch the connection states between connection and disconnection in each logical block. Accordingly, unnecessary connections are not formed, and unnecessary wiring lines are prevented from contributing to the capacitance. As a result, the capacitance between unnecessary wiring lines can be eliminated, and the operation speed can be advantageously increased.

(Logical System Conversion)

A desired logical system can be converted into a logical system that is logically equivalent to the desired logical system and is expressed by a combination of look-up table circuits. This conversion is performed in the manner described below. A desired logical system is defined by a combination of truth tables. In regard to each truth table, data "0" or data "1" is assigned as an output value to each of the combinations that can be input. The number of the inputs of each truth table is represented by n.

For example, the combinations of input values to which "1" is assigned as an output value are extracted. Where there are m combinations of such input values, these combinations are expressed as $\{a_{11}, a_{12}, \ldots, a_{1n}\}$, $\{a_{21}, a_{22}, \ldots, a_{2n}\}, \ldots, \{a_{m1}, a_{m2}, \ldots, a_{mn}\}$. Here, $a_{ij}$ ($1 \le i \le m$) ($1 \le j \le n$) represents data "0" or data "1".

Where the inputs are represented by $in_1, in_2, \ldots,$ and $in_n$, the truth table is logically equivalent to the logical expression shown below. Here, for $1 \le i \le m$ and $1 \le j \le n$, $b_{ij} = /in_j$ when $a_{ij} = 0$, and $b_{ij} = in_j$ when $a_{ij} = 1$, where the symbol "/" represents logical negation.

$(\ldots (b_{11} AND b_{12}) AND b_{13}) AND b_{14}) AND \ldots ) AND b_{1n}) OR$ $(\ldots (b_{21} AND b_{22}) AND b_{23}) AND b_{24}) AND \ldots ) AND b_{2n}) OR$ $\ldots$ $(\ldots (b_{m1} AND b_{m2}) AND b_{m3}) AND b_{m4}) AND \ldots ) AND b_{mn})$ With the above expression, a desired truth table can be expressed with two-input AND circuit, a two-input OR circuit, and a NOT circuit (or an inverter). Accordingly, a desired logical system as a combination of truth tables is expressed with an AND circuit, an OR circuit, and a NOT circuit. A logical system expressed with an AND circuit, an OR circuit, and a NOT circuit in this manner is called an AND-Inverter Graph (AIG). It should be noted that a method of expressing a certain logical system with an AIG that is logically equivalent to the certain logical system is known, but the expression is not uniquely defined.

First, a desired logical system is converted into an AIG in the above manner. Where the number of the inputs of a look-up table circuit is represented by N, the AIG needs to be converted into a network of look-up table circuits that are logically equivalent to the AIG and have N inputs. This conversion is performed in the manner described below.

First, attention should be paid to the output of the AIG. A combination that has the same output as the output of the AIG and is formed with an AND circuit, an OR circuit, or a NOT circuit, which has N or less inputs in total, is replaced with one look-up table circuit that is logically equivalent to this combination.

For each of the inputs of the above look-up table circuit, a combination formed with an AND circuit, an OR circuit, or a NOT circuit, which has the input of the above look-up table circuit as the output and has N or less inputs in total, is replaced with one look-up table circuit that is logically equivalent to this combination. This operation is continued until the inputs of the desired logical system are obtained. In this manner, the desired logical system is converted into a network of look-up table circuits having N or less inputs.

The above described example of a desired logical system is a combinational logic. In the case of a sequential logic, for each of the flip-flops that temporarily store the logical values existing in the sequential logic, the input of the flip-flop is virtually regarded as an output of the logical system, and the output of the flip-flop is virtually regarded as an input of the logical system. In that case, the logical system is first converted into an AIG, and is then converted into a network of look-up table circuits, through the same operation as the above described operation.

After this operation, basic logic elements including the look-up table circuits and flip-flops, and flip-flops not included in the basic logic elements need to be arranged. This is performed in the manner described below.

First, a combination of a flip-flop and the look-up table circuit that makes an output to this flip-flop is formed. In a case where the output terminal of a certain look-up table circuit is connected to the input terminals of two or more flip-flops, the second and later flip-flops are not combined with any look-up table circuit, and are formally regarded as basic logic elements not including any look-up table circuit. After that, attention should be paid to which output terminals are connected to which input terminals among the basic logic elements in the target logical system, and the basic logic elements are arranged in logical blocks so that tightly connected basic logic elements are included in the same logical block.

In each logical block, attention is then paid to which output terminals are connected to which input terminals among the basic logic elements in the target logical system, and arrangement is performed so that more tightly connected basic logic elements are connected with wiring lines that can be connected only to the output terminals of some of the basic logic elements and some of the flip-flops in a logical block of this embodiment.

It should be noted that the following numbers are artificially determined: the number of the basic logic elements that can be disposed in each logical block, the number of the wiring lines that can be connected only to the output terminals of some of the basic logic elements and some of the flip-flops in each logical block, and the number of the basic logic elements or the flip-flops that can be connected to the respective wiring lines.

In a case where flip-flops not included in any basic logic element are prepared, after the basic logic elements are arranged in logical blocks in the above manner, the flip-flops formally regarded as the basic logic elements not including any look-up table circuit are regarded as flip-flops not included in any basic logic element. In this manner, the basic logic elements each including a look-up table circuit and a flip-flop, and the flip-flops not included in any basic logic element are arranged.

Also, there is a known specific method of converting a certain logical system into an AIG logically equivalent to the certain logical system, and converting the AIG into a logically equivalent logical system expressed by a combination of look-up table circuits. This method is a method of minimizing the number of the look-up table circuits existing in the path that extends from an input from outside to the logical system, and reaches an output to the outside of the logical system. This means that the arithmetic processing time is minimized. That is, as the operation speed of the circuit is high, the use of this method is preferable not only in reducing the area but also in increasing the operation speed of the circuit.

There also is a known method of reducing the total number of the look-up table circuits constituting a logical system. This method is preferable, having a greater effect in reducing the area.

There is a known method of arranging basic logic elements each including a look-up table circuit and a flip-flop, and flip-flops not included in the basic logic elements. By this method, attention is drawn to the logical connection relationships between the look-up table circuits and the flip-flops, and a look-up table circuit and a flip-flop that are more tightly connected are arranged in the same logical block. The use of this method is preferable, because this method can effectively increase the operation speed of the circuit.

This operation was actually performed in cases where the numbers of the inputs of each look-up table circuit were three, four, five, and six, and the numbers of the necessary wiring lines were examined. The results of the examination show that, if the total number of the basic logic elements that can be arranged in each logical block and the flip-flops not included in the basic logic elements is 10 or larger, the number of the wiring lines that extend from one end to the other end of a logical block and can be connected to the output terminals of all the basic logic elements and all the flip-flops in the logical block may be smaller than the total number of the basic logic elements that can be arranged in the logical block and the flip-flops not included in the basic logic elements. In view of this, the total number of the basic logic elements arranged in each logical block and the flip-flops not included in the basic logic elements is preferably 10 or larger.

The results of the examination also show that, if the total number of the basic logic elements that can be arranged in each logical block and the flip-flops not included in the basic logic elements is 27 or larger, the sum of the number of the wiring lines that extend from one end to the other end of a logical block and can be connected to the output terminals of all the basic logic elements and all the flip-flops in the logical block, and the number of the wiring lines belonging to the wiring line group of the wiring lines that can be connected only to the output terminals of some of the basic logic elements and some of the flip-flops in the logical block may be smaller than the total number of the basic logic elements that can be arranged in the logical block and the flip-flops not included in the basic logic elements. In view of this, the total number of the basic logic elements arranged in each logical block and the flip-flops not included in the basic logic elements is more preferably 27 or larger.

The above described semiconductor device of this embodiment includes the flip-flops $128_1$ through $128_4$ not included in the basic logic elements, for example. However, even if there are no flip-flops not included in the basic logic elements, it is of course possible to achieve the same effects as above.

Also, in this embodiment, a logical block 120 includes basic logic elements and flip-flops not included in the basic logic elements. However, the logical block 120 may include a non-rewritable logical operation circuit, such as an AND circuit or an OR circuit with a certain number of inputs, in addition to the basic logic elements and the flip-flops. A logical block in which a non-rewritable logical operation circuit is provided may coexist with a logical block in which any non-rewritable logical operation circuit is not provided. It is of course possible to achieve the same effects as above.

Also, in this embodiment, the wiring line groups $122a$, $122b$, $122c_1$, and $122c_2$ each have four wiring lines. However, the number of the wiring lines in any of these wiring line groups does not need to be four. Even if the number of the wiring lines in each of those wiring line group is larger than four or is smaller than four, it is of course possible to achieve the same effects as above. Also, even if the numbers of the wiring lines in those wiring line groups differ from one another, it is of course possible to achieve the same effects as above.

Also, in this embodiment, four input wiring lines are connected to the input terminals of each look-up table circuit, but the number of the input wiring lines does not need to be four. Even if the number of the input wiring lines is larger than four or is smaller than four, it is of course possible to achieve the same effects as above.

Further, in this embodiment, each of the wiring line groups $122c_1$ and $122c_2$ is connected to the output terminals of two basic logic elements, and two flip-flops not included in the two basic logic elements. However, the numbers of the basic logic elements and the flip-flops do not need to be two. Even if the numbers of the basic logic elements and the flip-flops are larger than two, it is of course possible to achieve the same effects as above.

Also, the number of the basic logic elements having output terminals connected to the wiring line group $122c_1$ may differ from the number of the basic logic elements having output terminals connected to the wiring line group $122c_2$. It is of course possible to achieve the same effects as above.

Further, the number of the flip-flops having output terminals connected to the wiring line group $122c_1$ may differ from the number of the flip-flops having output terminals connected to the wiring line group $122c_2$. It is of course possible to achieve the same effects as above.

Also, in this embodiment, in addition to the wiring line groups $122c_1$ and $122c_2$, there may be a wiring line group that can be connected to the output terminals of some of the basic logic elements and some of the flip-flops of a logical block 120. It is of course possible to achieve the same effects as above.

Further, in this embodiment, the wiring line groups $122a$ and $122b$ differ in length from the wiring line groups $122c_1$ and $122c_2$, and these wiring line groups have two different lengths. However, the wiring line groups may have three or more different lengths. It is of course possible to achieve the same effects as above.

Also, in this embodiment, each basic logic element includes a select circuit. However, this select circuit may be replaced with a switch element that can take two different resistance values and is capable of storing the resistance values in a nonvolatile manner. It is of course possible to achieve the same effects as above.

Further, in this embodiment, a rewritable logical operation circuit has been described. However, this embodiment is not limited to rewritable logical operation circuits. As shown in FIGS. 7A through 7D, a rewritable logical operation circuit may coexists with a non-rewritable logical operation circuit, such as an application specific integrated circuit (ASIC). FIGS. 7A through 7D show examples of shapes and arrangement of a rewritable logical operation circuit and a non-rewritable logical operation circuit. However, the shapes and arrangement of these two circuits are of course not necessarily the same as those in the examples shown in FIGS. 7A through 7D. It is of course possible to achieve the same effects as above.

In each of the examples shown in FIGS. 7A through 7D, one rewritable logical operation circuit and one non-rewritable logical operation circuit are disposed. However, even if two or more rewritable logical operation circuits and one non-rewritable logical operation circuit are disposed, or one rewritable logical operation circuit and two or more non-rewritable logical operation circuits are disposed, or two or more rewritable logical operation circuits and two or more non-rewritable logical operation circuits are disposed, as shown in FIGS. 8A through 8D, it is of course possible to achieve the same effects as above. The shapes, the arrangement, and the numbers of rewritable logical operation circuits and non-rewritable logical operation circuits are of course not limited to those in the examples shown in FIGS. 8A through 8D. It is of course possible to achieve the same effects as above.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising
a logical block configured to perform a logical operation, the logical block including at least one first input terminal and at least two first output terminals,
wherein the logical block includes:
a first wiring line group including a plurality of wiring lines, at least one of the wiring lines of the first wiring line group being connected to the at least one first input terminal;
a second wiring line group including a plurality of shorter wiring lines than the wiring lines of the first wiring line group;
a third wiring line group including a plurality of shorter wiring lines than the wiring lines of the first wiring line group;
a fourth wiring line group including a plurality of wiring lines each intersecting with the wiring lines of the first and second wiring line groups;
a fifth wiring line group including a plurality of wiring lines each intersecting with the wiring lines of the first and third wiring line groups;
a first switch circuit including switch elements disposed in respective cross regions between at least one of the wiring lines of the first wiring line group and at least one of the wiring lines of the fourth wiring line group, each of the switch elements of the first switch circuit including a first terminal connected to the corresponding one of the wiring lines of the first wiring line group, and a second terminal connected to the corresponding one of the wiring lines of the fourth wiring line group;
a second switch circuit including switch elements disposed in respective cross regions between at least one of the wiring lines of the first wiring line group and at least one of the wiring lines of the fifth wiring line group, each of the switch elements of the second switch circuit including a third terminal connected to the corresponding one of the wiring lines of the first wiring line group, and a fourth terminal connected to the corresponding one of the wiring lines of the fifth wiring line group;
a third switch circuit including switch elements disposed in respective cross regions between at least one of the wiring lines of the second wiring line group and at least one of the wiring lines of the fourth wiring line group, each of the switch elements of the third switch circuit including a fifth terminal connected to the corresponding one of the wiring lines of the second wiring line group, and a sixth terminal connected to the corresponding one of the wiring lines of the fourth wiring line group;
a fourth switch circuit including switch elements disposed in respective cross regions between at least one of the wiring lines of the third wiring line group and at least one of the wiring lines of the fifth wiring line group, each of the switch elements of the fourth switch circuit including a seventh terminal connected to the corresponding one of the wiring lines of the third wiring line group, and an eighth terminal connected to the corresponding one of the wiring lines of the fifth wiring line group;
a first logical element configured to perform a logical operation, the first logical element including second and third input terminals connected to at least one of the wiring lines of the fourth wiring line group, and a second output terminal connected to one of the at least two first output terminals; and
a second logical element configured to perform a logical operation, the second logical element including fourth and fifth input terminals connected to at least one of the wiring lines of the fifth wiring line group, and a third output terminal connected to another of the at least two first output terminals.

2. The device according to claim 1, wherein
the first logical element further includes:
a first look-up table circuit including sixth and seventh input terminals and a fourth output terminal, the sixth and seventh input terminals being connected to the second and third input terminals, respectively;
a first flip-flop including an eighth input terminal and a fifth output terminal, the eighth input terminal being connected to the fourth output terminal; and
a first select circuit including a ninth input terminal and a tenth input terminal and a sixth output terminal, the ninth and tenth input terminals being connected to the fourth and fifth output terminals, respectively, the sixth output terminal being connected to the second output terminal, and
the second logical element further includes:
a second look-up table circuit including eleventh and twelfth input terminals and a seventh output terminal, the eleventh and twelfth input terminals being connected to the fourth and fifth input terminals, respectively;
a second flip-flop including a thirteenth input terminal and an eighth output terminal, the thirteenth input terminal being connected to the seventh output terminal; and
a second select circuit including fourteenth and fifteenth input terminals and a ninth output terminal, the fourteenth and fifteenth input terminals being connected to the seventh and eighth output terminals, respectively, the ninth output terminal being connected to the third output terminal.

3. The semiconductor device according to claim 1, further comprising:
a third wiring line intersecting with at least one of the wiring lines of the first wiring line group and at least one of the wiring lines of the second wiring line group;
a fourth wiring line intersecting with at least one of the wiring lines of the second wiring line group;
a seventh switch circuit including switch elements disposed in respective cross regions between at least one of the wiring lines of the first wiring line group and the third wiring line, each of the switch elements of the seventh switch circuit including a thirteenth terminal connected to the corresponding one of the wiring lines of the first wiring line group, and a fourteenth terminal connected to the third wiring line;

an eighth switch circuit including switch elements disposed in respective cross regions between at least one of the wiring lines of the second wiring line group and the third wiring line, each of the switch elements of the eighth switch circuit including a fifteenth terminal connected to the corresponding one of the wiring lines of the second wiring line group, and a sixteenth terminal connected to the third wiring line;

an ninth switch circuit including switch elements disposed in respective cross regions between at least one of the wiring lines of the second wiring line group and the fourth wiring line, each of the switch elements of the ninth switch circuit including a seventeenth terminal connected to the corresponding one of the wiring lines of the second wiring line group, and an eighteenth terminal connected to the fourth wiring line; and a third flip-flop including an input terminal connected to the third wiring line, and an output terminal connected to the fourth wiring line.

4. The device according to claim 1, wherein the switch elements are elements switchable from one of a high-resistance state and a low-resistance state to the other one of the high-resistance state and the low-resistance state.

5. The device according to claim 1, further comprising:

a first wiring line intersecting with at least one of the wiring lines of the second wiring line group, the first wiring line being connected to the second output terminal;

a second wiring line intersecting with at least one of the wiring lines of the third wiring line group, the second wiring line being connected to the third output terminal;

a fifth switch circuit including switch elements disposed in respective cross regions between at least one of the wiring lines of the second wiring line group and the first wiring line, each of the switch elements of the fifth switch circuit including a ninth terminal connected to the corresponding one of the wiring lines of the second wiring line group, and a tenth terminal connected to the first wiring line; and a sixth switch circuit including switch elements disposed in respective cross regions between at least one of the wiring lines of the third wiring line group and the second wiring line, each of the switch elements of the sixth switch circuit including an eleventh terminal connected to the corresponding one of the wiring lines of the third wiring line group, and a twelfth terminal connected to the second wiring line.

6. The device according to claim 5, wherein
the first logical element further includes:

a first look-up table circuit including sixth and seventh input terminals and a fourth output terminal, the sixth and seventh input terminals being connected to the second and third input terminals, respectively;

a first flip-flop including an eighth input terminal and a fifth output terminal, the eighth input terminal being connected to the fourth output terminal; and a first select circuit including a ninth input terminal and a tenth input terminal and a sixth output terminal, the ninth and tenth input terminals being connected to the fourth and fifth output terminals, respectively, the sixth output terminal being connected to the second output terminal, and the second logical element further includes:

a second look-up table circuit including eleventh and twelfth input terminals and a seventh output terminal, the eleventh and twelfth input terminals being connected to the fourth and fifth input terminals, respectively;

a second flip-flop including a thirteenth input terminal and an eighth output terminal, the thirteenth input terminal being connected to the seventh output terminal; and a second select circuit including fourteenth and fifteenth input terminals and a ninth output terminal, the fourteenth and fifteenth input terminals being connected to the seventh and eighth output terminals, respectively, the ninth output terminal being connected to the third output terminal.

7. The semiconductor device according to claim 5, further comprising:

a third wiring line intersecting with at least one of the wiring lines of the first wiring line group and at least one of the wiring lines of the second wiring line group;

a fourth wiring line intersecting with at least one of the wiring lines of the second wiring line group;

a seventh switch circuit including switch elements disposed in respective cross regions between at least one of the wiring lines of the first wiring line group and the third wiring line, each of the switch elements of the seventh switch circuit including a thirteenth terminal connected to the corresponding one of the wiring lines of the first wiring line group, and a fourteenth terminal connected to the third wiring line;

an eighth switch circuit including switch elements disposed in respective cross regions between at least one of the wiring lines of the second wiring line group and the third wiring line, each of the switch elements of the eighth switch circuit including a fifteenth terminal connected to the corresponding one of the wiring lines of the second wiring line group, and a sixteenth terminal connected to the third wiring line;

an ninth switch circuit including switch elements disposed in respective cross regions between at least one of the wiring lines of the second wiring line group and the fourth wiring line, each of the switch elements of the ninth switch circuit including a seventeenth terminal connected to the corresponding one of the wiring lines of the second wiring line group, and an eighteenth terminal connected to the fourth wiring line; and a third flip-flop including an input terminal connected to the third wiring line, and an output terminal connected to the fourth wiring line.

8. The device according to claim 5, wherein the switch elements are elements switchable from one of a high-resistance state and a low-resistance state to the other one of the high-resistance state and the low-resistance state.

* * * * *